United States Patent [19]

McClelland

[11] Patent Number: 5,151,594
[45] Date of Patent: Sep. 29, 1992

[54] SUBPICOSECOND ATOMIC AND MOLECULAR MOTION DETECTION AND SIGNAL TRANSMISSION BY FIELD EMISSION

[75] Inventor: Gary M. McClelland, Palo Alto, Calif.

[73] Assignee: International Business Machines Corporation, Armonk, N.Y.

[21] Appl. No.: 780,655

[22] Filed: Oct. 18, 1991

[51] Int. Cl.[5] .......................................... H01J 37/285
[52] U.S. Cl. .................................... 250/306; 250/307; 250/423 F
[58] Field of Search .................... 250/306, 307, 423 F, 250/397

[56] References Cited

PUBLICATIONS

Plummer et al., Physics Today, Apr. 1975, pp. 63–71.
Gruebele et al., Ultrafast Reaction Dynamics, Physics Today, p. 24, May 1990.
Fink, Mono-Atomic Tips for Scanning Tunneling Microscopy, IBM Journal of Research and Development, vol. 30, p. 460 et seq, 1986.

Primary Examiner—Jack I. Berman
Attorney, Agent, or Firm—Henry E. Otto, Jr.

[57] ABSTRACT

A time-dependent record depicting the motion of one or more selected atoms with a time resolution equal to or shorter than $10^{-12}$ second is generated by applying an electric field to a field emission tip. Electrons emitted from the selected atoms are focused into a beam which is swept over a spatially resolved electron detector for sensing the intensity of the beam as a function of time for creating the record. One- or two-dimensional records can be generated without signal averaging. The electrons can be directed onto a spot on a surface where dynamics are to be probed, and the electrons scattered or emitted from said surface are then focused into the electron beam. This method can also be used for transmitting information to a remote location at high frequency.

22 Claims, 4 Drawing Sheets

SUBPICOSECOND ATOMIC AND MOLECULAR MOTION DETECTION AND SIGNAL TRANSMISSION BY FIELD EMISSION

This invention was made with Government support under Contract N00014-88-C-0419 awarded by the Department of the Navy and under Contract F49620-89-C-0068 awarded by the Department of the Air Force. The Government has certain rights in the invention.

TECHNICAL FIELD

This invention relates to a method and apparatus for generating a time-dependent record of the motion of atoms or molecules and/or transmitting information from a spot as small as a single atom to a remote location at high frequency.

BACKGROUND OF THE INVENTION

It has long been known that mechanical, chemical, and kinetic properties of matter are determined by the motion of atoms in the force field created by the motion of electrons. Such motion occurs on the Angstrom scale over a timescale set by vibrational motion of $10^{12}$–$10^{14}$ Hz.

Field emission microscopy (FEM) and field ion microscopy (FIM), developed in 1936 and 1951, respectively, were the first techniques to achieve nanometer-scale microscopic imaging of surfaces. These techniques employed a sharp, electrically biased tip as a highly intense source of electrons or ions. In the FEM, a large negative potential is applied to the sharp tip so that the strong field narrows the work function barrier to only a few angstroms. Electrons which tunnel through the barrier leave the tip, moving perpendicularly to the local surface; they are then accelerated onto a screen for imaging. For very sharp tips, the FEM resolution is as good as 5 Angstroms. In the FIM, the high field at a positive tip ionizes inert imaging atoms, which are accelerated to the screen. The strength of the field depends upon the position of the underlying surface atoms, enabling atomic resolution of the surface to be achieved.

The more recent development of femtosecond lasers made it possible to achieve the time resolution that enabled atomic vibrations and rotations to be followed during photochemical events. For example, see the paper by Gruebele et. al. entitled "Ultrafast Reaction Dynamics", published in Physics Today, page 24, May 1990. This was done by activating a large sample with a laser pulse and, at a precisely controlled later time, measuring with a second pulse some changing spectroscopic property related indirectly to the atomic coordinates. This method has several shortcomings: (1) it is indirect, in that it records a spectroscopic property or characteristic of the atom or molecule; (2) an atom or molecule can be optically probed only once during an entire event; and (3) a large sample must be used and signal averaging is required. No prior method known to applicant enables the recording of motion of an atom or group of atoms at the frequency of molecular vibration without signal averaging, and is capable of transmitting information as small as an atom from one location to a remote location at an ultra-high frequency.

There is a need for a method and apparatus that (1) can generate a time-dependent record of the motion of atoms directly, rather than, as in the past, indirectly, by sensing a spectroscopic property; (2) can focus on a single atom or group of atoms so that large ordered samples are not required; (3) can provide a complete record of data in real time, thereby not only obviating the need for signal averaging, but also allowing the observation of spontaneous, thermally activated events that cannot be synchronized; and (4) can transmit at high frequency to a remote location and detect information from a spot as small as a single atom.

SUMMARY OF THE INVENTION

A time-dependent record depicting the motion of one or more selected atoms with a time resolution equal to or shorter than $10^{-12}$ second is generated by applying an electric field to a field emission tip. Electrons emitted from the selected atoms are focused into a beam which is swept over a spatially resolved electron detector for sensing the intensity of the beam as a function of time for creating the record.

If the beam is focused to a point, the record will be one-dimensional. Deflecting the point-focused beam into a spiral pattern will increase the length of time during which the beam intensity can be continuously sensed. If the beam is partially defocused in one direction to provide a line focus at the detector and the beam is swept along a direction perpendicular to said one direction, both time and spatial resolution will be achieved along said one direction.

A two-dimensional record can be created by partially defocusing the beam in one direction into an image dissector lens to cause electrons originating from different regions of the tip to strike different parallel sections of the dissector lens, separately focusing each of these sections onto the detector, and scanning individual ones of these sections concurrently with a linear sweep.

These techniques permit the record to be generated in real time without signal averaging.

The electrons can be directed onto a spot on a surface where dynamics are to be probed, and the electrons scattered or emitted from said surface are then focused into the electron beam. Information from one or more atoms may be transmitted between locations at a bandwidth of at least $10^{12}$ Hz by applying an electrical field to a field emission tip for emitting electrons from the atom(s). The emitted electrons are deflected from one location to another location and the information represented by said electrons is detected at said other location.

BRIEF DESCRIPTION OF THE DRAWINGS

FIGS. 6A, 6B, and 6C are plots of traces representing emission intensity vs. time depicting the motion of an atom due to vibrational energy, desorption, and chemisorption, respectively.

DESCRIPTION OF THE PREFERRED EMBODIMENT

The term "record" as herein used in the specification and claims is intended to connote a manifestation which represents the areal density of electrons striking an electron detector time-integrated over a scan pattern in the form of a single sweep or spiral.

Figure 1:
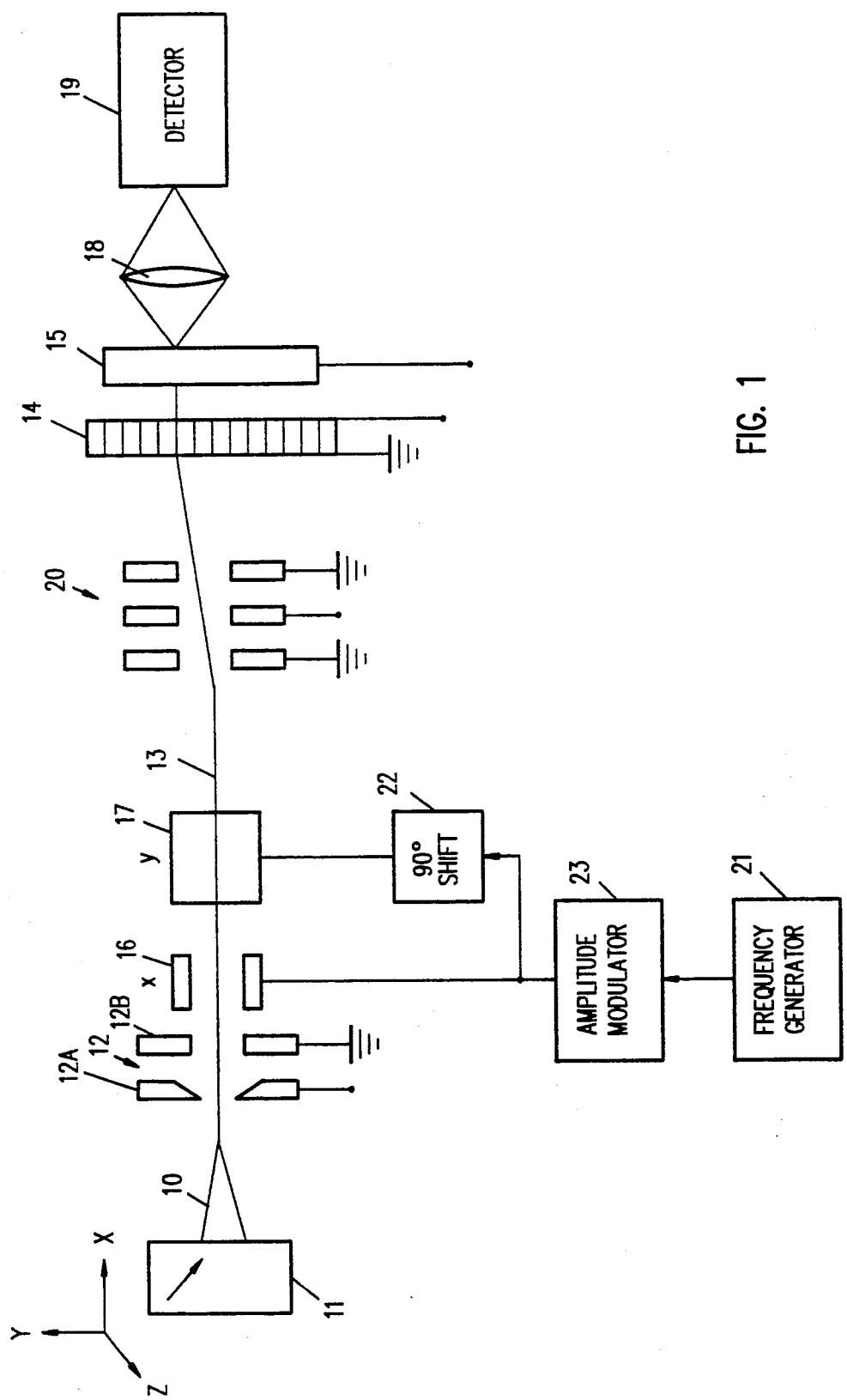
FIG. 1 is a schematic diagram of a subpicosecond atomic motion detection apparatus constructed according to one embodiment of the invention.

FIG. 1 illustrates an embodiment for generating a time-dependent record depicting the motion of one or more selected atoms with a time resolution equal to or less than $10^{-12}$ second.

Assume initially that the shape of a sharp field emission tip 10 has been characterized by field ion microscopy in a known manner, such as described, for example, by Fink in the IBM Journal of Research and Development, Vol. 30, at pp. 460 et seq (1986), who also taught that atoms on the tip could be imaged by ion microscopy. Tip 10 is mounted on a manipulator 11 that is translationally movable in x, y, and z directions. Tip 10 is positioned by manipulator 11 in front of a beamforming lens 12 comprising two circular elements 12a, 12b; as illustrated, 12a is negatively biased and 12b is connected to ground. Tip 10 is biased more negatively than lens 12 to cause field emission into the lens. Lens 12 focuses an electron beam 13 onto a microchannel image intensifier plate 14. From each incident electron of beam 13, microchannel plate 14 generates a current pulse which strikes a fluorescent screen 15, revealing the location of the incident electron.

When the focused beam 13 is swept across plate 14 by one or both of the deflecting fields of deflection plate 16, 17, the intensity of the trace on an electron detector vs. position constitutes a record of the intensity of electron emission from tip 10 vs. time. This electron detector, as illustrated, comprises the microchannel image intensifier plate 14, screen 15, a focusing lens 18, and a light image detector 19, such as a vidicon. However, if preferred, the electron detector could consist of plate 14, or of plate 14 and screen 15, if a permanent record is not required.

To expand the timescale on the fluorescent screen 15, the deflection of electron beam 13 can be amplified by adding a magnifying lens, such as an Einzel lens 20.

Moreover, the length of the time record can be increased by deflecting the electron beam 13 in a spiral, rather than a linear, scan pattern. (A raster scan cannot be used because it would require generating a sawtooth at an unachievably high frequency.) The spiral scan is achieved by focusing beam 13 to a point, and then applying a sinusoidal scanning voltage from a generator 21 to x deflection plate 16 and phase shifting this sinusoidal voltage by 90° with a phase shifter 22 to drive the y deflection plate 17. By varying the sine amplitude linearly in time using a modulator 23, the beam focused to a point will generate a spiral scan pattern, creating a record in the form of a trace of increased continuity.

In describing subsequent embodiments or variations, identical reference numerals will be used to denote elements which are or may be identical.

Figure 2:
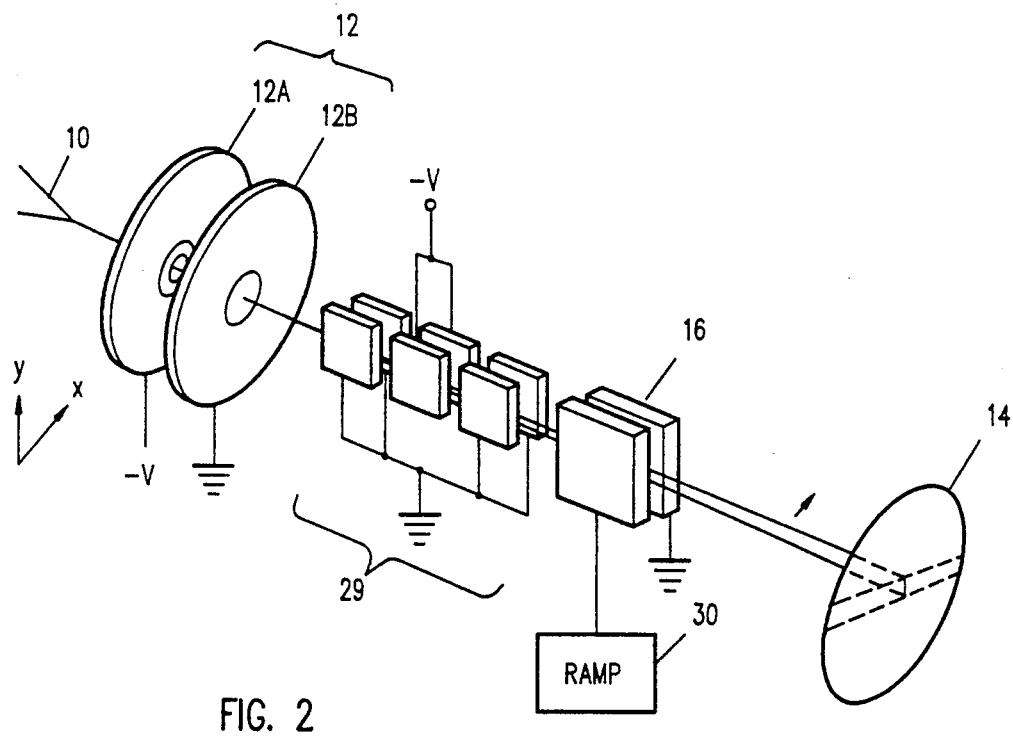
FIG. 2 is a perspective view of a subpicosecond atomic motion detection apparatus illustrating an alternative embodiment of the invention for generating a time-resolved record with one-dimensional spatial resolution on a field emission tip.

FIG. 2 illustrates how both spatial resolution along a single direction and temporal resolution can be achieved simultaneously. The angular divergence of electrons as they leave the field emission tip 10 actually contains spatial information; the angle of emission depends on the position on the tip from which an electron is emitted. Thus, if the electrons are brought defocused to an area on plate 14 rather than to a point, the distribution of intensity on the screen is a map of the intensity of the emission across the tip surface. However, to attain good time resolution, it is necessary to have a sharp focus along the direction perpendicular to the scanning direction.

These objectives are achieved by operating the initial circular focusing lens 12 at slightly below focusing voltage so that it by itself would produce a broadened spot rather than a point on the screen. As shown in FIG. 2, lens 12 is followed by a lens 29 that focuses the electron beam 13 only in the x direction through only one (16) of the field deflection plates. This brings the electron beam to a line focus at the microchannel plate 14, thus retaining spatial information along y, but losing the x spatial information. A linear ramp generator 30 is connected to deflection plate 16 for varying the field and enabling the beam 13 to be scanned along the x direction so that the time dependence is recorded along the x direction.

Figure 3:
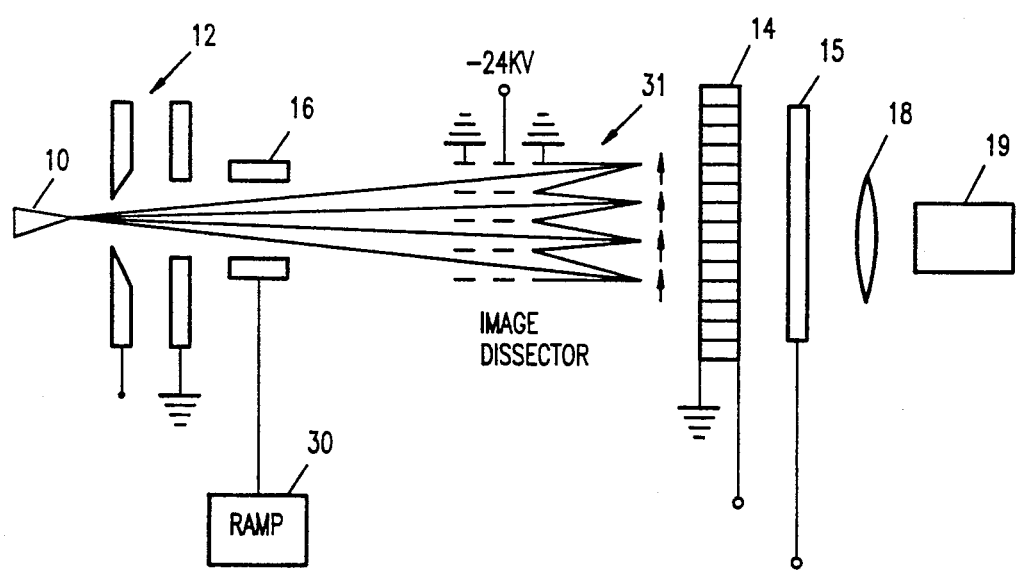
FIG. 3 is a schematic diagram of the apparatus constructed according to another alternative embodiment of the invention for generating a time-resolved record with two-dimensional spatial resolution on a field emission tip.
Figure 4:
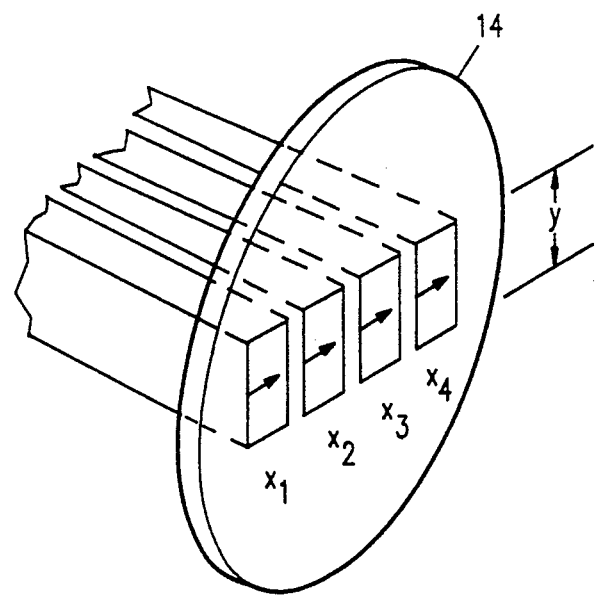
FIG. 4 is an isometric view of plate 14, to enlarged scale, showing how the two-dimensional scan pattern is generated in x and y directions.

FIG. 3 depicts an alternative embodiment of the invention for generating a two-dimensional, time-resolved record. This is achieved by also using only one (16) of the field deflection plates 16, 17 and connecting it to ramp voltage source 30, and by substituting an image dissector lens 31 for the Einzel lens 20. The main focusing lens 12 is partially "defocused" by operation at somewhat less than full focusing voltage. This causes the electrons that originate from different regions of tip 10, as characterized by different values of x (denoted as $x_1, x_2, x_3, x_4$), to strike different parallel sections of image dissector lens 31. Lens 31 focuses each of these parallel sections or stripes individually on microchannel plate 14, as depicted in FIG. 4. Electron beam 13 is deflected by plate 16, causing these stripes to be concurrently but individually scanned with a linear sweep in the x direction and thereby create the two-dimensional record. Thus, on the fluorescent screen 15, the y coordinate is a continuous representation of the y coordinate at which the electrons are emitted from the tip 10, whereas each stripe parallel to the y coordinate represents a separate range of x coordinates.

Figure 5:
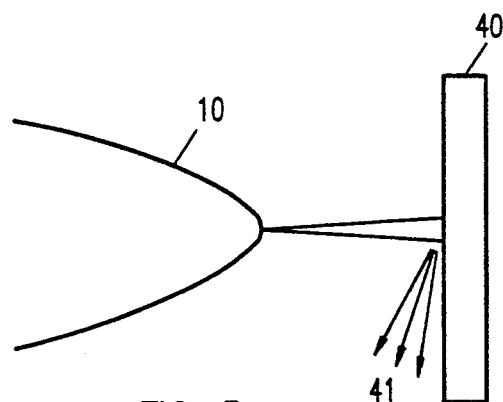
FIG. 5 is a fragmentary view, to enlarged scale, illustrating a variation of the embodiments shown in FIGS. 1, 2, and 3.

According to a variation of the invention, and as illustrated in FIG. 5, the configurations of FIGS. 1, 2, and 3 are modified by deriving the electron beam 13 indirectly from tip 10 in the following manner. A narrow beam of electrons is field emitted by tip 10 onto a selected spot on a surface 40, which may be a tip. Electrons scattered or emitted from surface 40 are focused by lens 12 into electron beam 13, and affect the intensity of the trace on screen 15. If the emission intensity from tip 10 is constant, the scattered or emitted electrons 41 will constitute a record of the atomic dynamics occurring on surface 40.

Figure 6A:
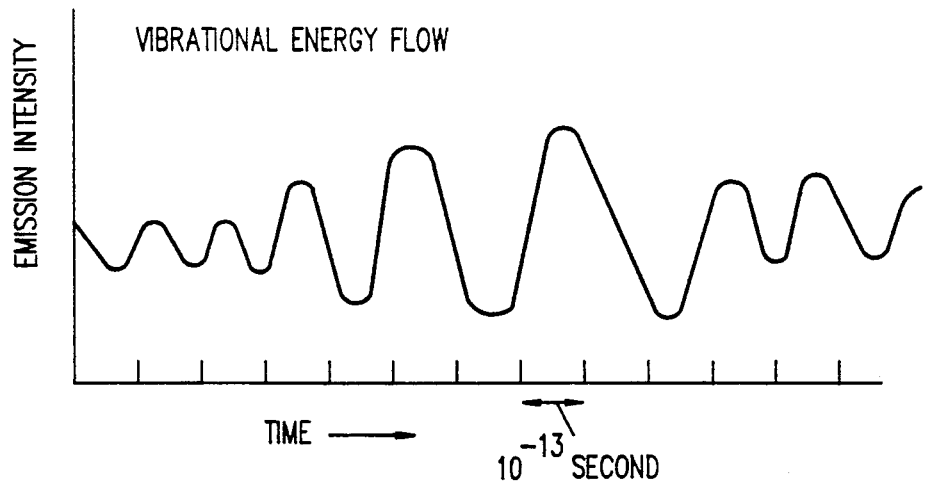
Figure 6B:
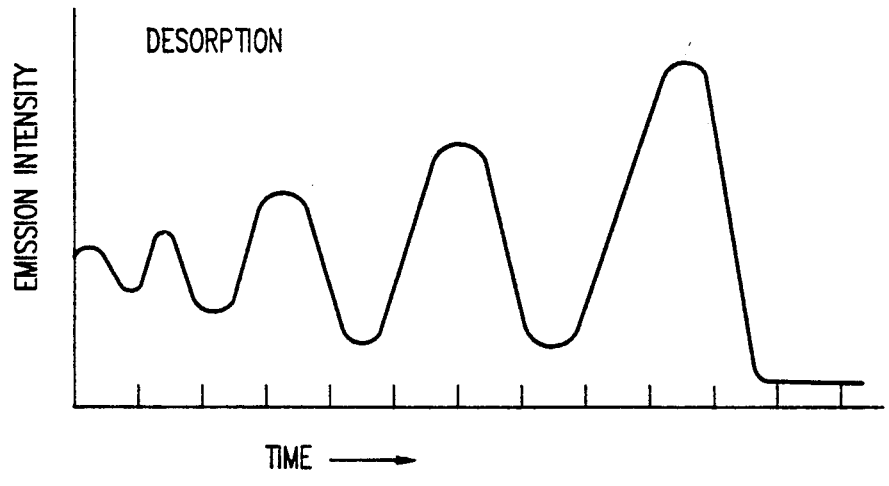
Figure 2C:
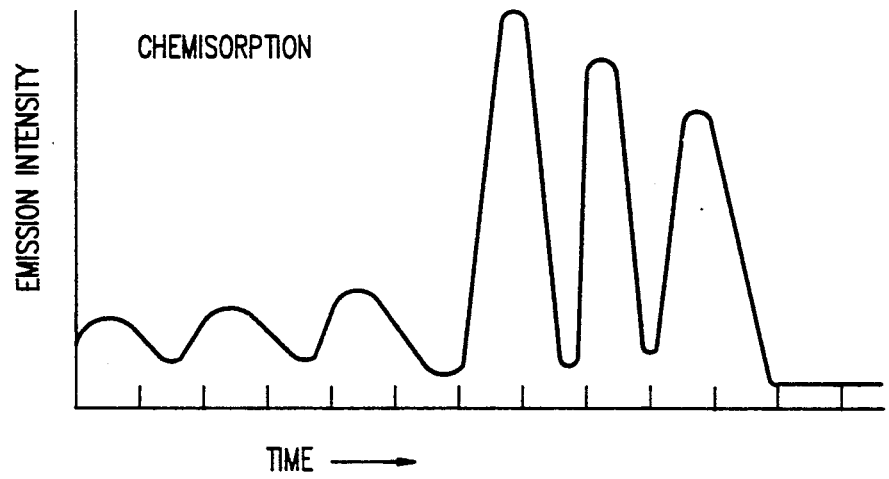

FIGS. 6A, 6B, and 6C illustrate the detail that can be revealed by use of this apparatus to study the motion of a spot as small as a single atom. In these figures, the oscillatory period seen is the vibrational period of a single atom. In FIG. 6A, vibrational motion is traced directly, and it shows the flow of vibrational energy into and out of the atom. The Fourier transform of this trace is the vibrational spectrum of a single atom, but the actual time trace is of more fundamental interest. FIG. 6B shows that by heating tip 10, evaporation of the atom on the tip can be observed after a large amount of energy flows into the tip. Tip evaporation during data recording can be encouraged by heating the tip 10 with a laser pulse just prior to recording. FIG. 6C records how the adsorption of an electronegative atom onto tip 10 initially releases extensive vibrational energy, but eventually reduces the emission by increasing the work function. Note that this apparatus is simply turned on and the motion is recorded in real time, just as with a video camera; and no critical timing, such as is required with laser pump-probe experiments, is needed.

Since field emission tips can be microfabricated by known techniques as parts of integrated circuits, field emission in a vacuum may also be used as a very high bandwidth method of transmitting information. The high field at the field emission tip results in very fast acceleration of the field emitted electrons so that a small spread in the velocity distribution results in a time-off-light spread of $10^{-12}$ seconds or less. Thus, the focused electron beam 13 can serve as a means of transmitting electrons between circuit elements at distances up to several centimeters apart with a bandwidth of at least $10^{12}$ Hz. Furthermore, the transmitting circuit element can be as small as a single atom. While femtosecond laser techniques can also achieve this transmission bandwidth, they cannot transmit information from such small areas.

Figure 7:
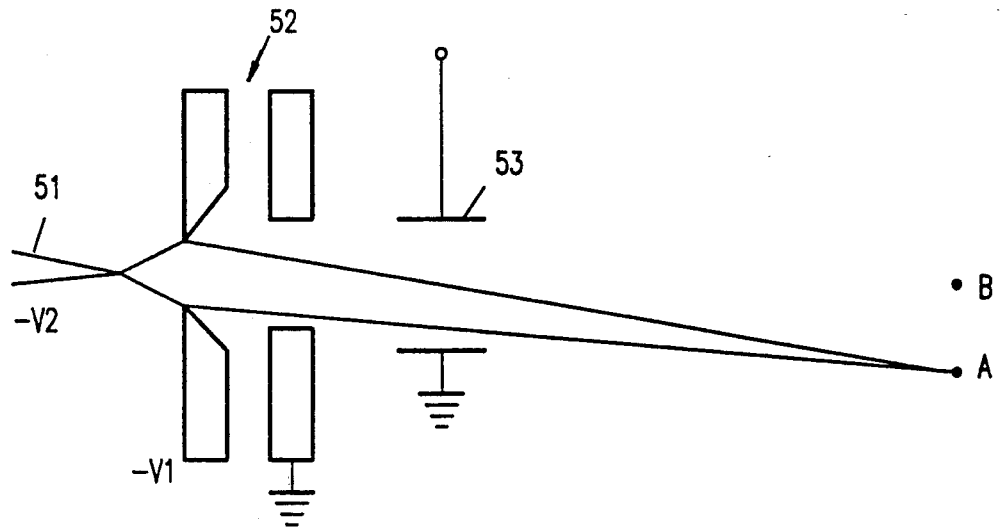
FIG. 7 is a schematic diagram illustrating how the principle of the invention may be used to transmit information from a spot as small as a single atom from one location to another at ultra-high frequency.

As illustrated in FIG. 7, field emission tip 51 transmits information to a location A through a focusing lens 52, which can also be microfabricated. The field deflecting plates 53 can be used to select between location A and one or more other locations, such as B. Switching between locations can be accomplished with a transmission bandwidth of $10^{13}$ Hz, although the rate of switching between locations will be determined by the circuitry which controls the voltage on the deflection plates 53.

The instrument described is capable of achieving the time resolution capable of following atomic-level events occurring at the tip for the following reasons:

(1) As Fink has shown, the tip can be made so sharp that field emission can be confined to a region of nanometers to as small as one atom across.

(2) Field emission from these small sources can be made so intense that many electrons are emitted over a vibrational timescale. For example, Fink has shown that 10 microamps can be emitted from a three-atom tungsten tip for several minutes, meaning that over a short 10 nanosecond period, currents of 50 microamps can probably be emitted, corresponding to 30 electrons over $10^{-13}$ second. These electrons can be focused and detected with nearly 100% efficiency.

(3) Because field emission is a tunneling process, it depends very strongly on the local work function and the presence of any localized resonance states, both of which can be strongly altered by the presence and position of surface atoms. For example, a cesium overlayer reduces the work function of tungsten by a factor of three, changing the field emission intensity by many orders of magnitude.

(4) The necessary sweep rates are achievable. It will be apparent that to achieve the theoretical time resolution at reasonable beam sweep rates, electron beam 13 must be focused tightly at the imaging plate 14. The electron optics design which has been developed for the field emission sources in scanning electron microscopes has been adopted to create a very narrow beam at the deflection electrode and a very small focus spot. It has been found by actual test that the deflecting electrodes can be spaced as little as 0.030 cm apart, that the beam needs to be scanned only a short distance, and that only a 200 volt sweep is required. Experiments have been performed with a time resolution of $10^{-12}$ second, and as frequently as three times per second, limited only by the rate at which the image can be stored on plate 14.

(5) The temporal information contained in the electron emission intensity must be retained during the focusing and deflection process. The time resolution of the apparatus is determined by the time of flight of the electrons. In conventional streak cameras which sweep electrons emitted from a photocathode over a detector, the temporal resolution is limited by the velocity spread of the electrons. In contrast, according to a feature of this invention, because tip 10 concentrates the field, electrons are accelerated so rapidly that an initially small spread in velocities is rendered insignificant.

If the field at tip 10 gives an acceleration a, the difference in time of flight at the tip region caused by an initial velocity v is v/a. For a, corresponding to a typical field of 0.5 volts/Angstrom, and v, corresponding to an electron energy spread of 0–0.5V, the resultant time-of-flight spread during the initial electron acceleration process near the tip is $5 \times 10^{-16}$ second. A further component to the time-of-flight spread originates during the flight from the region of relatively constant potential, beginning at 0.01 cm from the tip to the first lens 12a. If this region is 0.3 cm long and the electrons are at an energy of 2000V, this spread is $1.4 \times 10^{-14}$ second for an energy spread of 0.5 eV. This 0.3 cm is taken as the distance to the first lens 12a. As soon as the electrons are accelerated by lens 12, the effect of the initial spread in energies is reduced.

Since flight time dispersion after the sweeping fields does not affect where the electrons strike the microchannel plate 14, deflection plates 16, 17 which control the sweeping fields are preferably put as close to the focusing lens 12 as possible.

The $1.4 \times 10^{-14}$ second flight-time spread calculated above represents the fundamental time resolution limitation of the apparatus when manufactured by conventional techniques. However, if the optics are microfabricated, it is believed that the lens distance can be decreased to as little as 10 microns and thereby improve the time of resolution to $5 \times 10^{-16}$ second, limited only by the initial electron acceleration process at the tip.

While the invention has been described in connection with several preferred embodiments thereof, it will be understood that various changes may be made without departing from the spirit of the invention. Accordingly, the invention is not to be deemed limited except as specified in the claims.

I claim:

1. A method of generating a time-dependent record depicting the motion of one or more selected atoms with a time resolution equal to or shorter than 10-12 second, comprising the steps of:
    applying an electric field to a field emission tip for emitting electrons from the selected atoms;
    focusing the electrons into a beam; and
    sweeping the beam over a spatially resolved electron detector for sensing the intensity of the beam as a function of time for creating the record.

2. The method of claim 1, including, during the focusing step, focusing the beam to a point for causing the record to be one-dimensional.

3. The method of claim 2, including the step of deflecting the point-focused electron beam into a spiral pattern for increasing the length of time during which the beam intensity can be continuously sensed.

4. The method of claim 1, including the step of magnifying the beam before the sweeping step for expanding the timescale of the record on the detector.

5. The method of claim 1, including:
during the focusing step, partially defocusing the beam in one direction to achieve a line focus at the detector; and
during the sweeping step, sweeping the beam along a direction perpendicular to said one direction to achieve both time and spatial resolution along said one direction.

6. The method of claim 1, including the steps of:
during the focusing step,
partially defocusing the electron beam in one direction into an image dissector lens to cause electrons of the beam originating from different regions of the tip to strike different parallel sections of the dissector lens;
separately focusing each of these sections onto the detector; and
during the sweeping step, scanning individual ones of these parallel sections concurrently with a linear sweep for creating a two-dimensional record.

7. The method of claim 1, including, during the sweeping step, generating the record in real time without signal averaging.

8. The method of claim 1, including the steps of:
directing the emitted electrons onto a spot on a surface where dynamics are to be probed to cause electrons to be scattered or emitted from said surface; and
during the focusing step, focusing the scattered/emitted electrons into said beam.

9. The method of claim 1, including the step of using a laser pulse initiating an event at the tip concurrently with said applying step.

10. The method of claim 9, including the step of averaging signals representing portions of the record to create the record.

11. A method of transmitting information from one or more atoms from one location to another location at a bandwidth of at least $10^{12}$ Hz, comprising the steps of:
applying an electrical field to a field emission tip for emitting electrons from the atom(s);
deflecting the electrons from said one location to said other location; and
detecting at said other location the information represented by said electrons.

12. An apparatus for generating a time-dependent record depicting the motion of one or more selected atoms with a time resolution equal to or shorter than $10^{-12}$ second, comprising:
a field emission tip for emitting electrons from the selected atoms;
means for focusing the emitted electrons into a beam;
electron detector means; and
means for sweeping the beam relative to the electron detector means for causing the detector means to sense and record the intensity of the beam as a function of time for creating the record.

13. The apparatus of claim 12, including means for magnifying the beam to expand the timescale of the record as recorded on the detector means.

14. The apparatus of claim 12, including laser means for applying a laser pulse to the field emission tip to initiate an event at the tip to correspondingly influence the information depicted on the record.

15. The apparatus of claim 12, including means for averaging signals representing portions of the record.

16. The apparatus of claim 12, wherein the electron beam is focused to a line focus parallel to one preselected direction, and the beam is swept perpendicular to said one direction to provide spatial resolution on the tip along said one direction.

17. The apparatus of claim 12, wherein the focusing means focuses the beam to a point for causing the record created by said sweeping means to be one-dimensional.

18. The apparatus of claim 17, including means for deflecting the electron beam as focused into a point into a spiral pattern for increasing the length of time during which the record is generated as a continuous record.

19. An apparatus for generating a time- and spatially-dependent record depicting the motion of one or more selected atoms with a time resolution equal to or shorter than $10^{-13}$ second, comprising:
a field emission tip for emitting electrons from the selected atoms;
means for incompletely focusing the emitted electrons to create a partially divergent electron beam;
an image dissector lens for dividing the divergent electron beam into stripes;
an electron detector means; and
means for deflecting the electron beam in one direction to scan individual ones of these stripes concurrently with a linear sweep for creating a two-dimensional record on said electron detector means.

20. The apparatus of claim 19, wherein said sweeping means generates the record in real time without signal averaging.

21. An apparatus for transmitting information from one or more atoms from one location to another location at a bandwidth of at least $10^{12}$ Hz, comprising:
a field emission tip for emitting electrons from the atom(s);
means for focusing the emitted electrons into a beam; and
means for deflecting the beam for switching said beam from said one location to said other location to transmit to said other location the information represented by said beam.

22. An apparatus for generating a time-dependent record depicting, with a time resolution equal to or shorter than $10^{-12}$ second, the motion of one or more selected atoms on a surface whose dynamics are to be probed, comprising:
a field emission tip for emitting electrons from the selected atoms and directing said electrons toward a selected spot on said surface;
means for focusing into a beam the electrons scattered or emitted from said spot;
electron detector means; and
means for sweeping the beam relative to the electron detector means for causing the detector means to sense and record the intensity of the beam as a function of time for creating the record.

* * * * *

UNITED STATES PATENT AND TRADEMARK OFFICE
CERTIFICATE OF CORRECTION

PATENT NO. : 5,151,594

DATED : Sept. 29, 1992

INVENTOR(S) : McClelland

It is certified that error appears in the above-identified patent and that said Letters Patent is hereby corrected as shown below:

Column 6, line 61: "10-12" should be --$10^{-12}$--

Signed and Sealed this

Fifth Day of October, 1993

Attest:

BRUCE LEHMAN

Attesting Officer

Commissioner of Patents and Trademarks